(12) United States Patent
Debraal

(10) Patent No.: US 6,892,441 B2
(45) Date of Patent: May 17, 2005

(54) METHOD FOR FORMING ELECTRICALLY CONDUCTIVE PATHWAYS

(75) Inventor: John Charles Debraal, Appleton, WI (US)

(73) Assignee: Appleton Papers Inc., Appleton, WI (US)

( * ) Notice: Subject to any disclaimer, the term of this patent is extended or adjusted under 35 U.S.C. 154(b) by 267 days.

(21) Appl. No.: 09/839,126

(22) Filed: Apr. 23, 2001

(65) Prior Publication Data

US 2002/0152604 A1 Oct. 24, 2002

(51) Int. Cl.$^7$ ............................ H01P 11/00; H05K 3/10
(52) U.S. Cl. ............................ 29/601; 29/600; 29/831; 427/96.1; 427/98.9; 343/700 R
(58) Field of Search ............................ 427/96.1, 98.9, 427/96, 148, 150, 98; 29/600, 601, 846, 831; 343/700 R

(56) References Cited

U.S. PATENT DOCUMENTS

| | | |
|---|---|---|
| 3,864,179 A | 2/1975 | Davidoff |
| 3,909,912 A | 10/1975 | Kiesling |
| 3,950,204 A | 4/1976 | Williams |
| 4,265,703 A | 5/1981 | Terliska |
| 4,294,867 A | 10/1981 | Boaz |
| 4,303,489 A | 12/1981 | Morrison, Jr. |
| 4,407,685 A | 10/1983 | Hankland |
| 4,465,538 A * | 8/1984 | Schmoock ............... 29/846 X |
| 4,719,470 A | 1/1988 | Munson |
| 4,800,397 A | 1/1989 | Afzali-Ardakani et al. |
| 4,894,184 A | 1/1990 | Fukuoka et al. |
| 4,937,935 A | 7/1990 | Clariou |
| 4,958,560 A | 9/1990 | Collins |
| 5,061,093 A | 10/1991 | Yamaguchi et al. |
| 5,137,560 A | 8/1992 | Ohmura et al. |
| 5,189,952 A | 3/1993 | Ohmura et al. |
| 5,204,681 A | 4/1993 | Greene |
| 5,291,205 A | 3/1994 | Greene |
| 5,332,412 A | 7/1994 | Manabe et al. |
| 5,388,509 A | 2/1995 | Cutcher |
| 5,390,595 A | 2/1995 | Cutcher |
| 5,492,750 A | 2/1996 | Shumaker, Jr. et al. |
| 5,581,257 A | 12/1996 | Greene et al. |
| 5,604,972 A | 2/1997 | McCarrick |
| 5,792,298 A | 8/1998 | Sauer et al. |
| 5,792,520 A | 8/1998 | Yamashita et al. |
| 5,826,328 A * | 10/1998 | Brady et al. ............... 29/600 X |
| 5,826,329 A * | 10/1998 | Roth ............................ 29/846 |
| 5,831,531 A | 11/1998 | Tuttle |
| 5,836,187 A | 11/1998 | Janssen et al. |

(Continued)

FOREIGN PATENT DOCUMENTS

| | | | | |
|---|---|---|---|---|
| JP | 57-187296 | * | 11/1982 | ............ 427/148 X |
| JP | 1-106612 | * | 4/1989 | ............... 29/600 |
| JP | 2-74095 | * | 3/1990 | ............... 427/96 |

OTHER PUBLICATIONS

Giesecke et al, "High Power Thick Film Circuitry on Pecos (Pocelain Enamel Coating on Steel; Substrates)", IEEE Transactions on Electro International, Conference Proceedings, May 1994, pp. 847–854.*

Primary Examiner—A. Dexter Tugbang
(74) Attorney, Agent, or Firm—Birch, Stewart, Kolasch & Birch, LLP.

(57) ABSTRACT

The present invention provides for a system and two methods for forming electrically conductive pathways. These pathways can be connected with a microchip in order to form a radio frequency identification tag. A first method uses a thermal transfer ribbon, coated with a conductive material that is engaged with a receiver substrate. A thermal print head will heat a composition on the thermal transfer ribbon in order to transfer it to the receiver substrate. This transfer composition forms the electrically conductive pathway or antenna. In an alternative method, a receiver substrate is heated in order to react conductive material thereon. This receiver substrate is also heated by a thermal print head to form an electrically conductive pathway.

10 Claims, 2 Drawing Sheets

U.S. PATENT DOCUMENTS

| | | |
|---|---|---|
| 5,850,181 A | 12/1998 | Heinrich et al. |
| 5,850,187 A | 12/1998 | Carrender et al. |
| 5,856,788 A | 1/1999 | Walter et al. |
| 5,872,523 A | 2/1999 | Dellaverson et al. |
| 5,874,724 A | 2/1999 | Cato |
| 5,874,896 A | 2/1999 | Lowe et al. |
| 5,874,902 A | 2/1999 | Heinrich et al. |
| 5,883,582 A | 3/1999 | Boweres et al. |
| 5,883,886 A | 3/1999 | Eaton et al. |
| 5,902,437 A | 5/1999 | McDonough et al. |
| 5,905,249 A | 5/1999 | Reddersen et al. |
| 5,905,949 A | 5/1999 | Hawkes et al. |
| 5,906,228 A | 5/1999 | Keller |
| 5,914,862 A | 6/1999 | Ferguson et al. |
| 5,920,287 A | 7/1999 | Belcher et al. |
| 5,923,001 A | 7/1999 | Morris et al. |
| 5,923,572 A | 7/1999 | Pollock |
| 5,929,760 A | 7/1999 | Monahan |
| 5,929,779 A | 7/1999 | MacLellan et al. |
| 5,932,280 A | 8/1999 | Roth |
| 5,936,527 A | 8/1999 | Isaacman et al. |
| 5,939,223 A | 8/1999 | Cotte et al. |
| 5,939,984 A | 8/1999 | Brady et al. |
| 5,942,978 A | 8/1999 | Shafer |
| 5,942,987 A | 8/1999 | Heinrich et al. |
| 5,944,069 A | 8/1999 | Nusbaumer et al. |
| 5,945,920 A | 8/1999 | Maletsky |
| 5,945,938 A | 8/1999 | Chia et al. |
| 5,949,335 A | 9/1999 | Maynard |
| 5,950,110 A | 9/1999 | Hendrickson |
| 5,955,950 A | 9/1999 | Gallagher, III et al. |
| 5,955,951 A | 9/1999 | Wischerop et al. |
| 5,959,530 A | 9/1999 | Lupien, Jr. et al. |
| 5,959,531 A | 9/1999 | Gallagher, III et al. |
| 5,959,533 A | 9/1999 | Layson, Jr. et al. |
| 5,960,844 A | 10/1999 | Hamaya |
| 5,962,834 A | 10/1999 | Markman |
| 5,962,837 A | 10/1999 | Main et al. |
| 5,963,132 A | 10/1999 | Yoakum |
| 5,963,134 A | 10/1999 | Bowers et al. |
| 5,963,136 A | 10/1999 | O'Brien |
| 5,963,144 A | 10/1999 | Kruest |
| 5,964,656 A | 10/1999 | Lawler, Jr. et al. |
| 5,969,609 A | 10/1999 | Murdoch |
| 5,972,156 A | 10/1999 | Brady et al. |
| 5,973,598 A | 10/1999 | Beigel |
| 5,973,599 A | 10/1999 | Nicholson et al. |
| 5,973,600 A | 10/1999 | Mosher, Jr. |
| 5,973,601 A | 10/1999 | Campana, Jr. |
| 5,974,078 A | 10/1999 | Tuttle et al. |
| 5,983,118 A | 11/1999 | Lee |
| 5,983,288 A | 11/1999 | Vise |
| 5,986,562 A | 11/1999 | Nikolich |
| 5,987,331 A | 11/1999 | Grube et al. |
| 5,987,739 A | 11/1999 | Lake |
| 5,989,751 A | 11/1999 | Cotte et al. |
| 5,990,042 A | 11/1999 | Mochizuki et al. |
| 5,995,006 A | 11/1999 | Walsh |
| 5,995,046 A | 11/1999 | Belcher et al. |
| 5,995,048 A | 11/1999 | Smithgall et al. |
| 6,008,727 A | 12/1999 | Want et al. |
| 6,013,949 A | 1/2000 | Tuttle |
| 6,018,299 A | 1/2000 | Eberhardt |
| 6,021,315 A | 2/2000 | Telewski |
| 6,024,142 A | 2/2000 | Bates |
| 6,025,780 A | 2/2000 | Bowers et al. |
| 6,025,781 A | 2/2000 | Deschenes |
| 6,025,784 A | 2/2000 | Mish |
| 6,025,860 A | 2/2000 | Rosenfeld et al. |
| 6,027,027 A | 2/2000 | Smithgall |
| 6,030,728 A | 2/2000 | Cotte et al. |
| 6,036,099 A | 3/2000 | Leighton |
| 6,038,118 A | 3/2000 | Guerra |
| 6,040,773 A | 3/2000 | Vega et al. |
| 6,040,774 A | 3/2000 | Schepps |
| 6,043,746 A | 3/2000 | Sorrells |
| 6,044,353 A | 3/2000 | Pugliese, III |
| 6,045,652 A | 4/2000 | Tuttle et al. |
| 6,046,676 A | 4/2000 | Ward et al. |
| 6,046,683 A | 4/2000 | Pidwerbetsky et al. |
| 6,049,278 A | 4/2000 | Guthrie et al. |
| 6,049,745 A | 4/2000 | Douglas et al. |
| 6,069,564 A | 5/2000 | Hatano et al. |
| 6,072,383 A | 6/2000 | Gallagher, III et al. |
| 6,072,994 A | 6/2000 | Phillips et al. |
| 6,075,707 A | 6/2000 | Ferguson et al. |
| 6,075,997 A | 6/2000 | Lindqvist et al. |
| 6,078,251 A | 6/2000 | Landt et al. |
| 6,078,259 A | 6/2000 | Brady et al. |
| 6,078,791 A | 6/2000 | Tuttle et al. |
| 6,084,967 A | 7/2000 | Kennedy et al. |
| 6,087,930 A | 7/2000 | Kulka et al. |
| 6,087,940 A | 7/2000 | Caperna et al. |
| 6,091,332 A | 7/2000 | Eberhardt et al. |
| 6,094,138 A | 7/2000 | Eberhardt et al. |
| 6,094,173 A | 7/2000 | Nylander |
| 6,094,565 A | 7/2000 | Alberth et al. |
| 6,097,301 A | 8/2000 | Tuttle |
| 6,100,804 A | 8/2000 | Brady et al. |
| 6,104,281 A | 8/2000 | Heinrich et al. |
| 6,104,291 A | 8/2000 | Beauvillier et al. |
| 6,104,295 A | 8/2000 | Gaisser et al. |
| 6,107,920 A | 8/2000 | Eberhardt et al. |
| 6,108,636 A | 8/2000 | Yap et al. |
| 6,111,506 A | 8/2000 | Yap et al. |
| 6,123,796 A | 9/2000 | Kathmann et al. |
| 6,175,332 B1 | 1/2001 | Fedors |

* cited by examiner

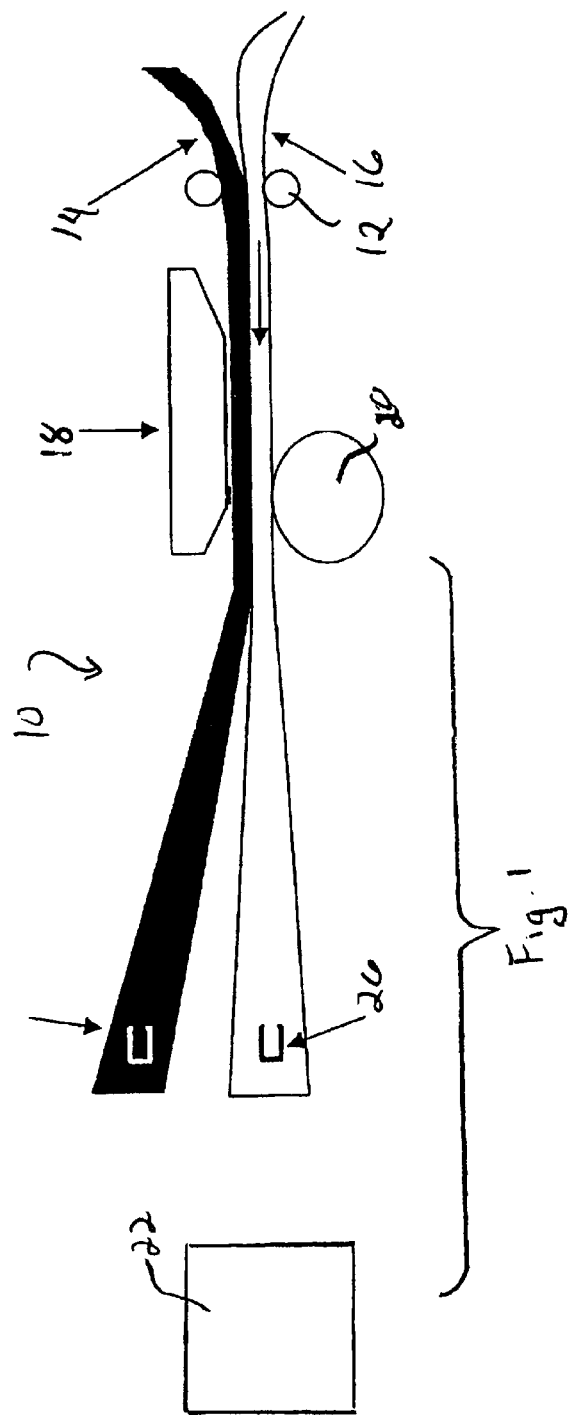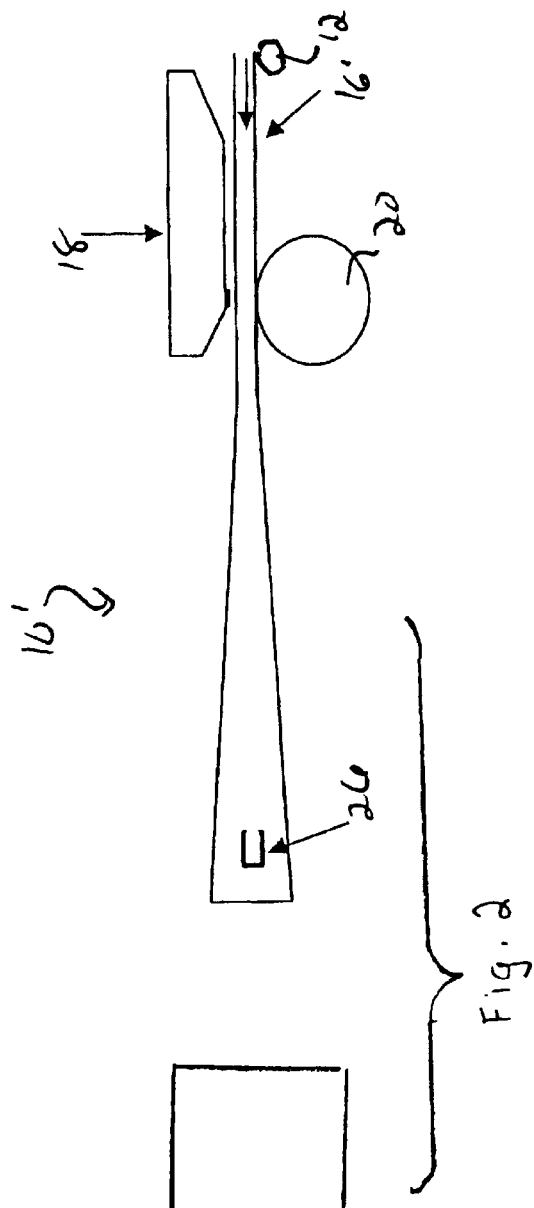

METHOD FOR FORMING ELECTRICALLY CONDUCTIVE PATHWAYS

BACKGROUND OF THE INVENTION

1. Field of the Invention

The present invention relates to methods for forming electrically conductive pathways. In particular, the methods are for making variably printed radio frequency antennas for radio frequency tags.

2. Description of the Background Art

Various printing arrangements for forming antennas are known. However, variable demand printing for forming electrically conductive pathways or antennas is not known.

SUMMARY OF THE INVENTION

Accordingly, it is an object of the present invention to provide a method and system to produce variable on-demand printing of conductive pathways. Such pathways can be used to form antennas for radio frequency tags. Two different methods can be utilized for forming such conductive pathways.

In one of these methods, the following steps are carried out: providing a thermal transfer ribbon, moving the thermal transfer ribbon past a heat source, engaging the thermal transfer ribbon with a receiver substrate as the thermal transfer ribbon moves past the heat source, selectively heating portions of the thermal transfer ribbon with the heat source, and transferring a composition from the thermal transfer ribbon to the receiver substrate, the selective heating enabling a desired pattern of the composition to be transferred to the receiver substrate, the composition including an electrically conductive material.

In another method for forming electrically conductive pathways, the following steps are carried out: providing a substrate coated with reactive material, moving the substrate past a heat source, selectively heating portions of the substrate with the heat source, and developing the reactive material on the substrate during exposure to heat from the heat source to develop a desired pattern on the substrate, the reactive material becoming an electrically conductive material.

Yet another object of the invention is to enable a radio frequency tag to be produced by using a receiver substrate which has an electrically conductive pathway formed thereon and by using a microchip. This microchip can be affixed on or embedded in the receiver substrate before or after the electrically conductive pathway is formed.

Further, it is an object of the present invention to also provide a system for producing radio frequency tags comprising a conveyor for moving a substrate, a thermal print head, the conveyor moving the substrate past the thermal print head, the thermal print head being selectively actuatable to heat a desired pattern on the substrate, means on the substrate for reacting with the heat source to form electrically conductive pathways, the means including a heat sensitive composition on the substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic side view of a first system for forming electrically conductive pathways of the present invention;

FIG. 2 is a schematic side view of a second system for forming electrically conductive pathways of the present invention.

DETAILED DESCRIPTION OF THE PREFERRED EMBODIMENT

Figure 3:
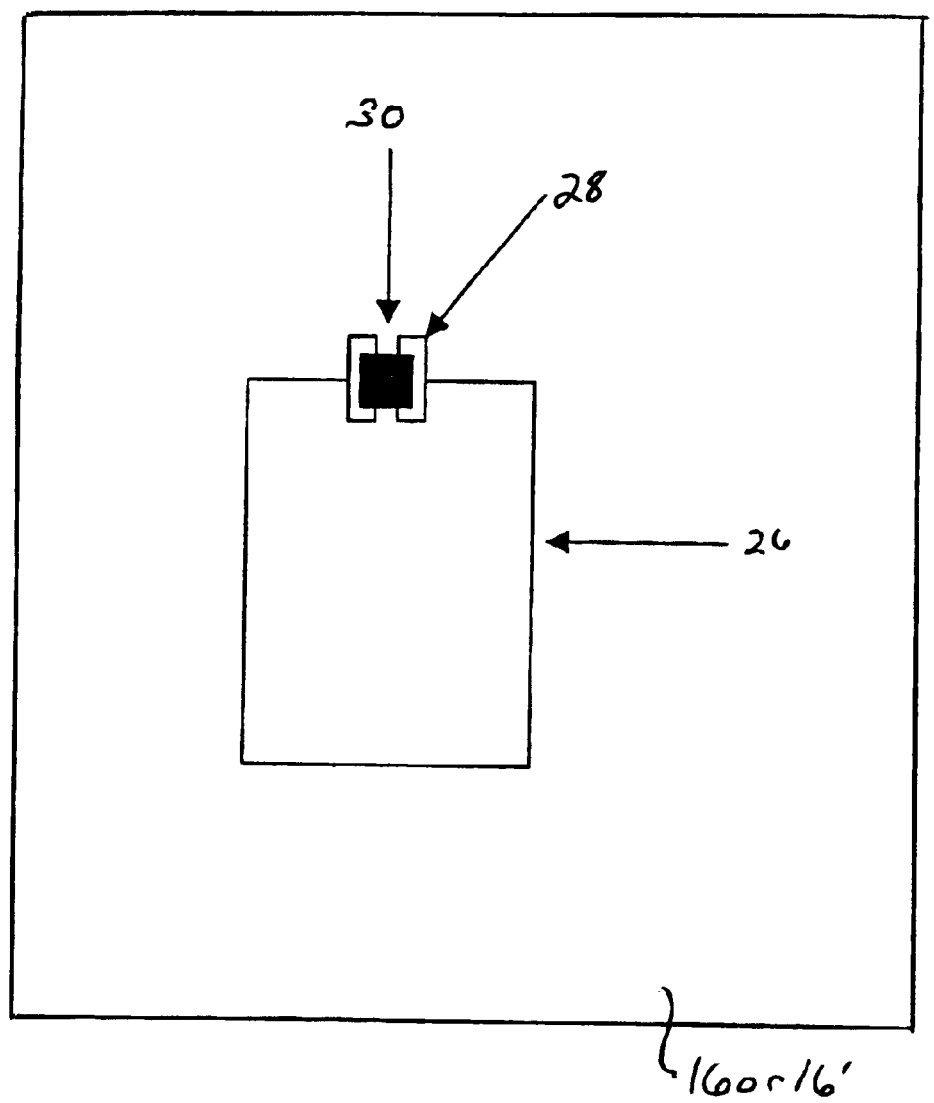
FIG. 3 is a perspective view of a radio frequency tag produced by either method of the present invention.

Referring in detail to the drawings and with particular reference to FIG. 1, a first system 10 for forming electrically conductive pathways is shown. This system 10 includes a conveyor 12 for infeeding a thermal transfer ribbon 14 and a received substrate 16. This conveyor 12 is only schematically shown in FIG. 1 as a pair of feed rolls. It should be appreciated that any type of conveyor system could be utilized. For example, a belt conveyor, chain conveyor, series of rollers, or any other known conveyor system could be used. Moreover, while only a pair of rollers 12 are shown, it should be contemplated that a continuous conveyor can be used over the length of the system 10 or any suitable number of conveyor units can be incorporated into the conveyor system.

The thermal transfer ribbon 14 and receiver substrate 16 are fed past a heat source or thermal print head 18. The thermal print head 18 will selectively heat portions of the thermal transfer ribbon 14 to ultimately form a desired pattern on the receiver 16, as will be discussed below. While such a thermal print head 18 is known, its use in a method for forming electrically conductive pathways is new. In addition, a backing roller 20 is provided to support the thermal transfer ribbon 14 and receiver substrate 16. While a backing roller 20 is shown, it should be noted that other support surfaces could be used. For example, a flat supporting table or other structure could be opposed to the print head 18.

Downstream from the thermal print head 18 is a device 22 for applying a microchip 30 onto the treated receiver substrate 16. While the substrate 16 is shown in FIG. 1 as terminating before the device 22, it is contemplated that the sheet 16 could instead be continually fed through the device 22. Alternatively, after treatment, the receiver 16 can be cut and then the cut sections fed to the device 22. This device 22 can be any known device which will apply a microchip 30 onto the treated received substrate 16 in order to form a radio frequency tag 24, as shown in FIG. 3. Alternatively, this device 22 could be omitted and the receiver substrate 16 can have microchips already incorporated thereon. The microchips 30 can be applied to the surface or embedded in the receiver substrate 16.

The thermal transfer ribbon 14 has a reactive coating or a conductive transferable material thereon. When this reactive coating or material is heated by the thermal print head 18, an electrically conductive pathway can be printed on the receiver substrate 16. Thermal transfer ribbon 14 either has a conductive material or a material that becomes conductive upon the application of heat. The heat from print head 18 will serve to transfer the material to receiver substrate 16 and in some instances will also serve to activate the material to make it conductive. In those circumstances, the transferred composition will be an electrical conductor precursor.

The use of this print head 18 allows printing of a conductive pathway in any shape, length, or size onto the receiver substrate 16. Thus, great flexibility is had with the use of the thermal print head 18. The electrically conductive pathway 26 is schematically shown in FIG. 1. When the device for applying a microchip 22 handles the receiver substrate 16 with the electrically conductive pathway 26, a microchip can be placed thereon in order to form a radio frequency tag. While a generally U-shaped pathway is shown, it is important to note that the length, width, shape and size of the pathway can easily be varied by using print head 18. The conveyor 12 will enable on-the-fly printing of pathways 26. Of course, batch processing is also possible. In such an arrangement, a continuous transfer ribbon and receiver substrate can be incrementally fed past the print head 18 or discrete portions of a ribbon 14 and substrate 16 could be used. For example, a feeder conveyor could move rectangular overlaying sheets of transfer ribbon and substrate through the system 10 past the print head 18.

The thermal transfer ribbon 14 is brought into engagement with the receiver substrate 16. This engagement, along with the heating of the thermal transfer ribbon 14 by the thermal print head 18, will cause transfer of a conductive composition from the ribbon 14 to the receiver substrate 16. Thus, a complicated arrangement using magnets, as taught in U.S. Pat. No. 5,061,093 to Yamaguchi et al. for example, is not needed.

The thermal transfer ribbon 14 is coated with the conductive composition. The transfer ribbon is made up of a transfer substrate which can be made from a polymeric film or paper. Suitable transfer substrate materials include, but are not limited to, paper, polyester, polyethylene naphthalate, polyamide, polyolefin, cellulose and polycarbonate. One preferred transfer substrate is polyester film, manufactured by Dupont™ under the Mylar™ brand name. Generally, Mylar™ is a polyester flexible film. Important properties of the transfer substrate include high tensile strength, thin thickness and low heat resistance.

The transfer substrate of the thermal transfer ribbon is coated with a conductive composition that is designed to be transferred to the received substrate 16 using the thermal print head 18. This coating is comprised of a conductive material, wax, binders, surfactants, dispersants and other additives. The primary component of the transfer layer is the electrically conductive material. The conductive material may be comprised of metallic inks, metallic substances, metallic dispersions, metallic salts, carbon based inks, or other conductive substances, etc. A preferred metallic substance is manufactured by Parelec™ under the Paramod™ brand name. The higher the conductivity of the conductive material, the better.

The transfer coating for the thermal transfer ribbon 14 also contains a wax as another main component. The wax is designed to melt or soften under the heat supplied by the thermal print head 18. This will aid in the transfer of the coating layer to the receiver substrate 16. Examples of suitable waxes are carnuaba wax, paraffin wax, low molecular weight polyethylene wax, etc.

Binders are also included in the thermal transfer ribbon 14. These binders in the coating layer aid in cohesion of the coating and provide tack properties for adhesion to the receiver substrate 16. Examples of suitable binders are styrene copolymers, polyethylene resin, polystyrene, vinyl chloride polymers, vinyl acetate polymers, etc. Surfactants, dispersant and other additives are incorporated as needed for proper processing, coating and to aid in the transfer properties.

The transfer coating layer can be applied to the transfer ribbon substrate using a Meyer rod, airknife, roll coater, blade or any suitable coating method. The coat weight applied is in the range 1.5 g/m$^2$ to 30 g/m$^2$.

The coated transfer ribbon can then be used with the thermal print head 18 and a thermal printer to create any size, shape, length, etc. of an antenna to be incorporated with a microchip for a construction of a radio frequency identification tag 24. The conductive material is transferred onto the receiver sheet 16. This receiver sheet is a substantially non-conductive substrate such as paper, plastic film and the like. Alternatively, the sheet can be a conductive substrate that has been coated with an electrical insulating layer.

Turning now to FIG. 2, a second method and system 10' for forming electrically conductive pathways will be described. These pathways can also be used for antennas in radio frequency tags 24, similarly to that described in FIG. 1. Many of the components and alternative arrangements in this second system 10' are the same as that in the first system, and their description will not be repeated.

In the second system 10', a thermal transfer ribbon 14 is not used. Rather, a second receiver substrate 16' is utilized. This substrate used can be selected from paper, polymeric films, cellulose materials and other thin, flat substrates. This substrate is coated with a composition that is designed to react when exposed to heat generated from the thermal print head 18. This coating is comprised of a reducible metallic material, binders, fillers, surfactants, dispersants, and other additives.

The primary component of the transfer layer is the reducible metallic material. This reducible material may be comprised of sorbitol copper formate, copper sulfate, cuprite, tenorite, silver nitrate, and the like. The higher the conductivity of the reduced reducible material, the better.

Binders are included in the coating layer to aid in cohesion of the coating while not inhibiting the conductivity of the reduced material. Examples of suitable binders are styrene butadiene copolymers, polyvinyl alcohols, starch, vinyl chloride polymers, vinyl acetate polymers, methyl cellulose, etc. Surfactants, dispersants and other additives are incorporated as needed for proper processing, coating, and to aid in the transfer properties. The coating layer can be applied to the substrate using a Meyer rod, airknife, roll coater, blade or any other suitable coating method. The coat weight applied is in the range of 1.5 g/m$^2$ to 30 g/m$^2$.

The antenna may be formed by either method to create the antenna portion of a radio frequency tag. The antenna or electrically conductive pathway may be printed either before or after the microchip is affixed to the substrate. Thus, while the device 22 is shown downstream from the print head 18 in FIGS. 1 and 2, this device 22 could instead be upstream so that the microchip is first applied to the receiver substrate 16 or 16'. Alternatively, the device 22 can be omitted and substrates 16 or 16' using already incorporated microchips could instead be used. Optionally, an interposer 28 may be used to decrease the precision needed when forming an electrically conductive pathway relative to the microchip connection.

With the present system, variable, on-demand printed electrically conductive pathways can be formed. The invention utilizes two methods for printing the conductive pathways, thermal transfer and direct thermal. The printed conductive pathways are suitable for use as an antenna for a radio frequency identification tag 24. With the first described thermal transfer method, a ribbon 14 coated with a conductive material is used that is transferred to another substrate 16 upon application of heat by the thermal print head 18. In the direct thermal method, a receiver substrate 16' is used that has a conductive material which, when exposed to heat from a thermal print head 18, will form the conductive pathways.

To summarize the steps of the first method of forming electrically conductive pathways, a thermal transfer ribbon 14 is provided. This thermal transfer ribbon 14 is moved past a heat source or thermal print head 18 by conveyor 12. The thermal transfer ribbon 14 is engaged with a receiver substrate as it moves past the heat source or thermal print head 18. This thermal print head 18 will selectively heat portions of the thermal transfer ribbon 14, in order to transfer a composition to the receiver substrate 16. This transferred composition forms an electrically conductive pathway 26. The selective heating by the thermal print head 18 enables a desired pattern of composition to be transferred to the receiver substrate 16.

In the second method, a substrate 16' is provided with a reactive material. This substrate 16' is moved by conveyor 12 past a heat source or thermal print head 18. The heat source or thermal print head 18 can selectively heat portions of the substrate. This will develop the reactive material on the substrate 16' to develop a desired pattern on the substrate. This desired pattern will form the electrically conductive pathway 26.

With either method, a system 10 or 10' can be used. The conductive composition on ribbon 14 or the reducible material on the second receiver substrate will act as means on the substrate for reacting to heat from the heat source or print head 18. The conductive composition or reducible material is a heat sensitive composition on substrate 14 or 16'.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method of forming electrically conductive pathways for radio frequency tags, comprising the steps of:
   providing a thermal transfer ribbon;
   moving the thermal transfer ribbon past a heat source;
   engaging the thermal transfer ribbon with a flexible receiver substrate as the thermal transfer ribbon moves past the heat source;
   using paper or pliable film as the receiver substrate;
   selectively heating portions of the thermal transfer ribbon with the heat source;
   transferring a composition from the thermal transfer ribbon to the receiver substrate, the selective heating enabling a desired pattern of the composition to be transferred to the paper or film receiver substrate, the composition transferred from the thermal transfer ribbon being an electrically conductive material; and
   electrically connecting said composition on said receiver substrate to a microchip to form an antenna for a radio frequency tag.

2. The method of forming electrically conductive pathways for radio frequency tags as recited in claim 1, wherein the composition transferred from the thermal transfer ribbon is an electrical conductor precursor which is non conductive before heating which becomes an electrically conductive material upon application of heat from the heat source.

3. The method of forming electrically conductive pathways for radio frequency tags as recited in claim 1, further comprising the step of using a thermal print head as the heat source.

4. The method of forming electrically conductive pathways for radio frequency tags as recited in claim 1, wherein the thermal transfer ribbon fails to have magnetic particles and wherein transfer of the composition occurs solely due to heating and contact of the composition with the receiver substrate.

5. The method of forming electrically conductive pathways for radio frequency tags as recited in claim 1, wherein the antenna is used as the radio frequency identification tag and further comprising the step of affixing the microchip to the receiver substrate either before or after the step of transferring the composition.

6. The method of forming electrically conductive pathways for radio frequency tags as recited in claim 1, further comprising the steps of:
   using a polymeric film or paper as the transfer ribbon;
   coating the transfer ribbon with the conductive material and with at least one of wax, binders, surfactants and dispersants; and
   using at least one of metallic inks, metallic substances, metallic dispersions, metallic salts, carbon based inks as the composition.

7. The method of forming electrically conductive pathways for radio frequency tags as recited in claim 6, further comprising the steps of:
   using at least one of carnuaba wax, paraffin wax, low molecular weight polyethylene wax as the wax in the transfer ribbon; and
   using at least one of styrene copolymers, polyethylene resin, polystyrene, vinyl chloride polymers, and vinyl acetate polymers as the binders an the transfer ribbon.

8. The method of forming electrically conductive pathways for radio frequency tags as recited in claim 1, further comprising the step of using at least one of sorbitol copper formate, copper sulfate, cuprite, tenorite and silver nitrate as reactive material which forms the electrically conductive material.

9. The method of forming electrically conductive pathways for radio frequency tags as recited in claim 1, wherein said microchip is attached to the receiver substrate before transferring the composition.

10. The method of forming electrically conductive pathways for radio frequency tags as recited in claim 1, wherein said microchip is attached to the receiver substrate after transferring the composition.

* * * * *